United States Patent [19]
Tanigawa

[11] Patent Number: 5,879,981
[45] Date of Patent: Mar. 9, 1999

[54] METHOD OF FABRICATING A SEMICONDUCTOR MEMORY DEVICE

[75] Inventor: Takaho Tanigawa, Tokyo, Japan

[73] Assignee: NEC Corporation, Tokyo, Japan

[21] Appl. No.: 914,222

[22] Filed: Aug. 19, 1997

Related U.S. Application Data

[62] Division of Ser. No. 786,303, Jan. 22, 1997.

[30] Foreign Application Priority Data

Jan. 23, 1996 [JP] Japan .................................. 8-009435

[51] Int. Cl.$^6$ ............................................. H01L 21/8242
[52] U.S. Cl. ......................... 438/241; 438/250; 438/253; 438/393; 438/396
[58] Field of Search .................................. 438/241, 214, 438/239, 250, 253, 256, 381, 393, 396, 399

[56] References Cited

U.S. PATENT DOCUMENTS

| | | | |
|---|---|---|---|
| 5,352,623 | 10/1994 | Kamiyama ............................... | 438/396 |
| 5,405,800 | 4/1995 | Ogawa et al. ........................... | 438/253 |
| 5,432,732 | 7/1995 | Ohmi ....................................... | 257/310 |
| 5,608,248 | 3/1997 | Ohno ....................................... | 257/306 |
| 5,612,241 | 3/1997 | Arima ...................................... | 438/396 |
| 5,631,182 | 5/1997 | Suwanai et al. ......................... | 438/396 |

FOREIGN PATENT DOCUMENTS 3-270168  12/1991  Japan .

OTHER PUBLICATIONS

T. Tokuyama et al., "MOS LSI Fabrication Technology", published by Nikkel McGraw–Hill Inc., 1885, pp. 177–178.
IEDM 94, Technical Digest, pp. 927–929, "A 0.29–$\mu m^2$ MIM–Crown Cell and Process Technologies for 1–Gigabit Drams", published 1994.

Primary Examiner—Tuan H. Nguyen
Attorney, Agent, or Firm—Young & Thompson

[57] ABSTRACT

A semiconductor memory device including memory cells with the stacked-capacitor structure that makes it possible to prevent a contact pad from being damaged. This device includes a memory cell area and a peripheral circuit area formed on a semiconductor substrate. An interlayer insulating layer having first and second penetrating holes is formed to cover the entire substrate. A capacitor has lower and upper electrode and a dielectric located between these electrodes. The lower electrode is electrically connected to the first element through the first penetrating hole. Each of the peripheral circuits has a second element, a contact pad electrically connected to the second element, a pad insulating layer formed to cover the contact pad, a pad protection layer formed on the pad insulating layer, and an interconnection conductor electrically connected to the contact pad through a contact hole penetrating the pad protection and pad insulating layers. The contact pad is electrically connected to the second element through the second penetrating hole. The lower electrode and the contact pad are made by using a same conductive layer. The dielectric and the pad insulating layer are made by using a same insulative layer. The upper electrode and the pad protection layer are made by using a same conductive layer.

4 Claims, 12 Drawing Sheets

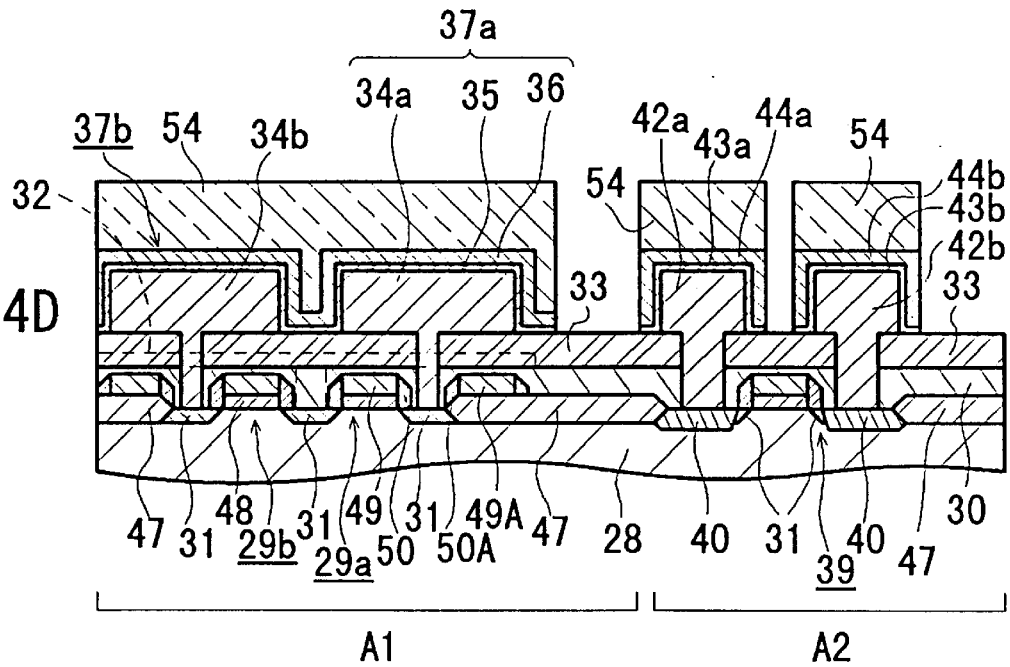
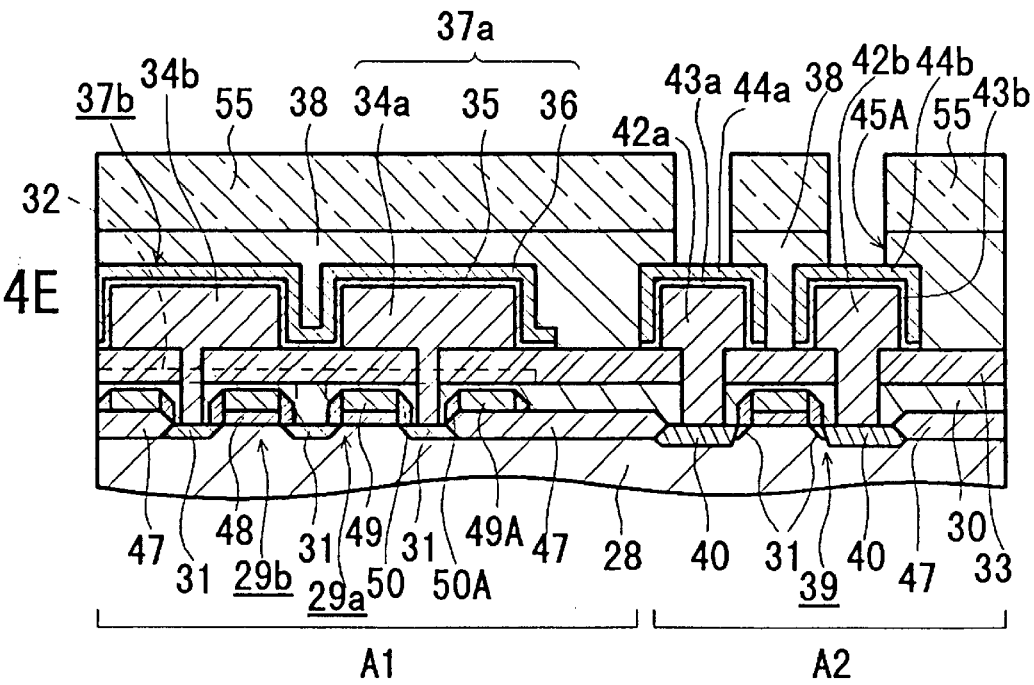

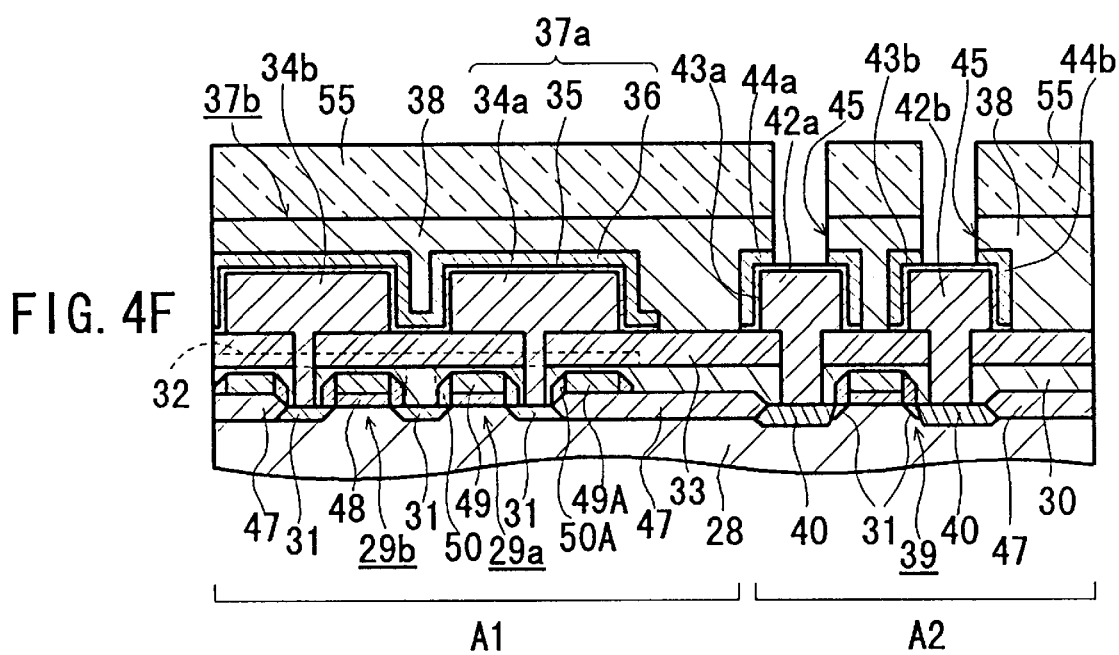

5,879,981

METHOD OF FABRICATING A SEMICONDUCTOR MEMORY DEVICE

This application is a division of copending application Ser. No. 08/786,303, filed Jan. 22, 1997.

BACKGROUND OF THE INVENTION

1. Field of the Invention

The present invention relates to a semiconductor memory device and more particularly, to a semiconductor Dynamic Random Access Memory (DRAM) device each memory cell of which has a stacked-capacitor structure, and a fabrication method of the device.

2. Description of the Prior Art

In recent years, the memory cell of DRAMs has been miniaturized more and more from generation to generation. Even if the memory cell is minimized, a specific charge is essentially stored in the storage capacitor of the cell to store the information.

The obtainable capacitance of the storage capacitor tends to decrease dependent upon the level of the miniaturization of the storage cell. On the other hand, the necessary capacitance of the capacitor is almost constant when the storing voltage to be applied across the capacitor is fixed. Therefore, it is necessary for the capacitor to compensate the capacitance decrease due to the miniaturization by, for example, increasing the surface area of the capacitor. This surface area increase has been popularly realized by increasing the thickness of the lower electrode (or, storage electrode) of the capacitor.

However, the thickness increase of the lower or storage electrode of the capacitor causes an excessive height difference between the memory cell area where the memory cells are arranged in a matrix array and the peripheral circuit area where the peripheral logic circuits for driving the memory cells are formed. As a result, an aluminum (Al) wiring layer which is formed over the memory cell area and the peripheral circuit area tends to have some excessively thin parts and/or to be partially broken.

Also, in the pattering step of the wiring layer, a photoresist film on the aluminum layer is patterned by using a photolithography process to thereby form an etching mask. The increased overall height of the capacitance causes an excessive focal point shift between the area located over the capacitor and the remaining area during the photolithography process. As a result, the patterning accuracy of the wiring layer will degrade.

Such the height difference as above can be relaxed or decreased by, for example, forming a thick interlayer insulating layer to cover the storage capacitors over the entire semiconductor substrate and then planarizing the surface of the interlayer insulating layer thus formed by a thermal reflowing process or Chemical-Mechanical Polishing (CMP) process. However, the thick interlayer insulating layer will cause another problem of disconnection or breaking of the aluminum wiring layer within contact holes. The reason is that the contact holes formed through the thick interlayer insulating layer have a large aspect ratio, which is defined as a ratio of the height of the holes with respect to the width/diameter of the holes. This results in degradation in step coverage of the aluminum wiring layer.

Then, to solve the above problem of disconnection or breaking of the aluminum wiring layer within the contact holes, an improved conventional structure where conductive pads for the capacitors are formed by using a conductive layer for forming the lower storage electrode of the capacitor was proposed. This conventional structure was disclosed in the Japanese Non-Examined Patent Publication No. 3-270168 published in December 1991.

The fabrication method of the conventional structure of the DRAM is explained below with reference to FIGS. 1A to 1F.

It is needless to say that this conventional DRAM has a lot of Metal-Oxide-Semiconductor Field-Effect Transistors (MOSFETs) and a lot of stacked capacitors in a memory cell area and a lot of MOSFETs in a peripheral circuit area. However, for the sake of simplification of description, only two of the MOSFETs and only two of the corresponding capacitors in the memory cell area and only one of the MOSFETs in the peripheral circuit area is explained here.

First, as shown in FIG. 1A, a field oxide layer 102 is selectively formed on a main surface of a p-type single-crystal silicon (Si) substrate 101 by a popular LOcal Oxidation of Silicon (LOCOS) process, thereby defining active regions in the surface area of the substrate 101 in the memory cell area A1 and the peripheral circuit area A2. The main surface of the substrate 101 is exposed from the field oxide layer 102 in the active regions.

Next, after impurity ions are selectively implanted into the active regions to adjust the threshold voltage of the MOSFETs, gate oxide layers 103 are selectively formed on the main surface of the substrate 101 in the respective active regions. An n-type polysilicon layer with a thickness of approximately 300 nm, which is doped with phosphorus (P), is formed over the entire substrate 101 by a popular Chemical Vapor Deposition (CVD) process. The n-type polysilicon layer is then patterned to form gate electrodes 104 on the corresponding gate oxide layers 103, and gate electrodes 104A on the field oxide layer 102.

Subsequently, using the gate electrodes 104 and the field oxide layer 102 as a mask, the active regions of the substrate 101 are selectively ion-implanted with phosphorus (P) with a dose of approximately $2 \times 10^{13}$ atoms/cm$^2$, thereby forming n$^-$-type diffusion regions 105 used for source/drain regions of the MOSFETs. A layer of High-Temperature Oxide (HTO) of silicon is formed over the entire substrate 101 by a Low-Pressure CVD (LPCVD) process and is etched back by an anisotropic etching process, thereby forming sidewall spacers 106 on the exposed main surface of the substrate 101 and sidewall spacers 106A on the field oxide layer 102 at each side of the respective gate electrodes 104.

Next, using a patterned photoresist film (not shown), the sidewall spacers 106 and the gate electrodes 104 as a mask, the active regions of the substrate 101 in the peripheral circuit area A2 are selectively ion-implanted with arsenic (As) with a dose of approximately $3 \times 10^{15}$ atoms/cm$^2$, thereby forming n$^+$-type diffusion regions 107 used for source/drain regions of the MOSFETs. Thus, Lightly-Doped Drain (LDD) structures are formed in the active regions for the n-channel MOSFETs in the peripheral circuit area A2.

After removing the above patterned photoresist film, using another patterned photoresist film (not shown) covering the memory cell area A1 and the active regions for the n-channel MOSFETs thus formed, the sidewall spacers 106 and the gate electrodes 104 as a mask, the remaining active regions of the substrate 101 in the peripheral circuit area A2 are selectively ion-implanted with boron difluoride (BF$_2$) with a dose of approximately $3 \times 10^{15}$ atoms/cm$^2$, thereby forming p-channel MOSFETs (not shown) in the peripheral circuit area A2.

Following this, a Boron-doped Phosphor-Silicate Glass (BPSG) layer 109 with a thickness of approximately 400 nm is formed by a CVD process over the entire substrate 101. The BPSG layer 109 serves as a first interlayer insulating layer located between the gate electrodes 104 and bit lines 108 which will be formed in the next step. The state at this stage is shown in FIG. 1A.

Further, as shown in FIG. 1B, the first interlayer insulating layer 109 is selectively etched to form a contact hole 110 vertically extending to the corresponding one of the $n^-$-type diffusion regions 105 in the memory cell area A1. A patterned conductive layer 108 serving as the bit lines is then formed on the first interlayer insulating layer 109. The bit line 108 thus formed are contacted with and electrically connected to the corresponding one of the $n^-$-type diffusion regions 105 in the memory cell area A1 through the contact hole 110.

Subsequently, a BPSG layer 111 serving as a second interlayer insulating layer is formed to cover the entire substrate 101 by a CVD process. The second interlayer insulating layer 111 and the underlying first interlayer insulating layer 109 are selectively etched to form contact holes 112 at corresponding locations to the $n^-$-type diffusion regions 105 in the memory cell area A1 and contact holes 113 at corresponding locations to the $n^+$-type diffusion regions 107 in the peripheral circuit area A2.

To form lower or storage electrodes 115 of the capacitors in the memory cell area A1 and contact pads 116 in the peripheral circuit area A2, an n-type polysilicon layer with a thickness of approximately 600 nm, which is doped with phosphorus, is deposited on the second interlayer insulating layer 111 by a CVD process. Using a patterned photoresist film 114 formed on the n-type polysilicon layer thus formed as a mask, the n-type polysilicon layer is patterned to thereby form the lower or storage electrodes 115 and the contact pads 116. The state at this stage is shown in FIG. 1C.

After removing the photoresist film 114, a silicon nitride ($Si_3N_4$) layer with a thickness of approximately 6 nm is deposited on the lower or storage electrodes 115, the contact pads 116, and the exposed second interlayer insulating layer 111 over the entire substrate 101. The $Si_3N_4$ layer is then oxidized in a steam atmosphere at a temperature of 850° C. for 30 minutes to thereby form a silicon dioxide ($SiO_2$) layer with a thickness of approximately 1 nm in the surface area of the $Si_3N_4$ layer. The combination of the $Si_3N_4$ layer and the $SiO_2$ layer thus formed serves as a common dielectric 117 of the capacitors, as shown in FIG. 1D.

An n-type polysilicon layer with a thickness of approximately 200 nm, which is doped with phosphorus, is then formed over the entire substrate 101 by a popular CVD process. Using a patterned photoresist film 118 formed on the common dielectric 117 as a mask, the n-type polysilicon layer thus formed is then etched to be selectively left in the memory cell area A1. If the gaseous mixture of carbon tetrachloride ($CCl_4$) and oxygen ($O_2$) is used as an etching gas, the polysilicon layer may be selectively etched while the common dielectric 117 made of the $Si_7N_4$ and $SiO_2$ layers is left substantially unchanged through this etching process in the peripheral circuit area A2.

Thus, a common upper or cell-plate electrode 119 of the capacitors is formed in the memory cell area A1 by the patterned, remaining n-type polysilicon layer. The state at this stage is shown in FIG. 1D. Each of the storage capacitors 120 is made of the corresponding lower or storage electrode 115, the common dielectric 117, and the common upper or cell-plate electrode 119.

Since the contact pads 116 in the peripheral circuit area A2 are formed by the same polysilicon layer as that of the lower or storage electrodes 115, the height of the pads 116 is almost the same as that of the capacitors 120, as shown in FIG. 1D.

After removing the patterned photoresist film 118, a BPSG layer 121 serving as a third interlayer insulating layer is formed to cover the entire substrate 101 by a CVD process. The third interlayer insulating layer 121 is then subjected to a heat-treatment in a nitrogen ($N_2$) atmosphere at a temperature of approximately 900° C., thereby planarizing the surface of the layer 121.

Using a patterned photoresist film 122 formed on the third interlayer insulating layer 121 as a mask, the layer 121 and the underlying dielectric 117 are selectively etched to form contact holes 123 exposing the underlying contact pads 116 in the peripheral circuit area A2, as shown in FIG. 1E. The contact holes 123 are located right over the $n^-$-diffusion regions 107, respectively.

Finally, after removing the photoresist film 122, an aluminum layer is formed on the third interlayer insulating layer 121 to be patterned, thereby forming wiring conductors 124 contacted with and electrically connected to the corresponding contact pads 116, respectively.

Thus, the conventional DRAM with the stacked-capacitor structure is finished, as shown in FIG. 1F.

The conventional fabrication method of the DRAM as shown in FIGS. 1A to 1F, however, has the following problem.

When the polysilicon layer for forming the common upper or cell-plate electrode 119 of the capacitors 120 is selectively etched away in the peripheral circuit area A2, even if the gaseous mixture of carbon tetrachloride ($CCl_4$) and oxygen ($O_2$) is used as an etching gas, the obtainable selection ratio of this etching process will be approximately 100 at the highest. This etching process using the above mixture of $CCl_4$ and $O_2$ was explained in the book entitled "MOS LSI FABRICDATION TECHNOLOGY" on page 177–178, written by T. Tokuyama and N. Hashimoto, published by Nikkei McGraw-Hill Inc. in 1985.

In this case, as shown in FIG. 2A, to completely remove the polysilicon layer 125 used for the common upper electrode 119 of the capacitors within the narrow space or gap 130 between the adjacent contact pads 116, the necessary etching period will be approximately three times as long as that of the popular etching process where no such the narrow space or gap 130 exists or longer. The reason is as follows.

In FIG. 2A, the contact pads 116 have the same height of approximately 600 nm from the main surface of the substrate 101; in other words, the space or gap 130 between the adjacent pads 116 has a large depth of approximately 600 nm. Therefore, the part of the polysilicon layer 125 which is buried in the space 130 is very difficult to be etched away using the etching mixture of $CCl_4$ and $O_2$. This results in the long etching period.

The excessively long etching period badly affects the common dielectric 117. Specifically, even if the dielectric 117 having a small thickness of approximately 6 nm is able to withstand the etching force or action during the popular etching period, it is unable to withstand the etching force during the excessively long etching period. As a result, the dielectric 117 tends to be broken, thereby exposing the underlying pads 116 from the dielectric 117. In the worst case, the pads 116 themselves are also broken in addition to the dielectric 117, as shown in FIG. 2B.

SUMMARY OF THE INVENTION

Accordingly, an object of the present invention is to provide a semiconductor memory device including memory cells with the stacked-capacitor structure that is able to prevent the damage of a contact pad from occurring, and a fabrication method thereof.

Another object of the present invention is to provide a semiconductor memory device including memory cells with the stacked-capacitor structure that makes it possible to increase the degree of freedom in designing the element or component layout, and a fabrication method thereof.

According to a first aspect of the present invention, a semiconductor memory device is provided, which includes a memory cell area and a peripheral circuit area formed on a semiconductor substrate. The memory cell area has memory cells. The peripheral circuit area has peripheral circuits for driving the memory cells. An interlayer insulating layer having first and second penetrating holes is formed to cover the entire substrate.

Each of the memory cells has a first element formed on the substrate, and a capacitor formed to be stacked over the first element. The first element is located below the interlayer insulating layer. The capacitor is located on the interlayer insulating layer.

The capacitor has a lower electrode, an upper electrode, and a dielectric located between the lower and upper electrodes The lower electrode is electrically connected to the first element through the first penetrating hole of the interlayer insulating layer.

Each of the peripheral circuits has a second element formed on the substrate, a contact pad electrically connected to the second element, a pad insulating layer formed to cover the contact pad, a pad protection layer formed on the pad insulating layer to cover the contact pad, and an interconnection conductor electrically connected to the contact pad through a contact hole penetrating the pad protection layer and the pad insulating layer.

The second element is located below the interlayer insulating layer. The pad insulating layer, the pad protection layer, and the interconnection conductor are located over the interlayer insulating layer. The contact pad is electrically connected to the second element through the second penetrating hole of the interlayer insulating layer.

The lower electrode of the capacitor and the contact pad are made by using a same conductive layer. The dielectric of the capacitor and the pad insulating layer are made by using a same insulative layer. The upper electrode of the capacitor and the pad protection layer are made by using a same conductive layer.

With the semiconductor memory device according to the first aspect of the present invention, since the lower electrode of the capacitor and the contact pad are made by using the same conductive layer, the lower electrode and the contact pad can be formed in the same process.

Also, the dielectric of the capacitor and the pad insulating layer is made by using the same insulative layer, and the upper electrode of the capacitor and the pad protection layer are made by using the same conductive layer. Therefore, a masking resist film can be patterned to cover not only the capacitor but also the contact pad during the patterning process for forming the dielectric and the upper electrode of the capacitor.

As a result, the damage of the contact pad is able to be prevented from occurring.

In a preferred embodiment of the device according to the first aspect, the pad protection layer is used for electrically connecting the contact pad to another contact pad or another interconnection conductor. In this case, an additional advantage that the degree of freedom in designing the element or component layout is able to be increased arises.

In another preferred embodiment of the device according to the first aspect, the pad protection layer has a composite structure including a refractory-metal silicide sublayer or a refractory metal layer, and a polysilicon layer. In this case, an additional advantage that the sheet resistance of the pad protection layer decreases occurs.

According to a second aspect of the present invention, a fabrication method of a semiconductor memory device is provided, which includes the following steps:

A first step is to form a first plurality of elements and a second plurality of elements on a semiconductor substrate. The first plurality of elements are located in a memory cell area. The second plurality of elements are located in a peripheral circuit area.

A second step is to form a first interlayer insulating layer to cover the first and second plurality of elements over the entire substrate. The first interlayer insulating layer has a first plurality of penetrating holes located in the memory cell area and a second plurality of penetrating holes located in the peripheral circuit area.

A third step is to form a first conductive layer on the first interlayer insulating layer. The first conductive layer is electrically connected to the first plurality of elements through the first plurality of penetrating holes in the memory cell area and the second plurality of elements through the second plurality of penetrating holes in the peripheral circuit area, respectively.

A fourth step is to pattern the first conductive layer to thereby form lower electrodes of capacitors in the memory cell area and contact pads in the peripheral circuit area. The lower electrodes are electrically connected to the first plurality of elements through the first plurality of penetrating holes, respectively. The contact pads are electrically connected to the second plurality of elements through the second plurality of penetrating holes, respectively.

A fifth step is to form an insulating layer to cover the lower electrodes and the contact pads over the entire substrate.

A sixth step is to form a second conductive layer on the insulating layer over the entire substrate.

A seventh step is to pattern the insulating layer and the second conductive layer to thereby form dielectric layers and upper electrodes of the capacitors in the memory cell area and pad insulating layers and pad protection layers in the peripheral circuit area.

An eighth is to form a second interlayer insulating layer to cover the upper electrodes of the capacitors and the pad protection layers over the entire substrate.

A ninth step is to form contact holes penetrating the pad insulating layers and the pad protection layers in the peripheral circuit area, thereby exposing the respective contact pads.

A tenth step is to form interconnection conductors contacted with and electrically connected to the contact pads through the corresponding contact holes, respectively.

With the fabrication method according to the second aspect, a masking resist film can be patterned to cover not only the capacitors but also the contact pads during the seventh step for patterning the insulating layer and the second conductive layer. As a result, the damage of the contact pad is able to be prevented from occurring.

In a preferred embodiment of the method according to the second aspect, in the seventh step, the insulating layer and the second conductive layer are patterned to be continuous between adjacent two ones of the contact pads in the peripheral circuit area.

In another preferred embodiment of the method according to the second aspect, a step of forming a metal layer on the second conductive layer is additionally provided between the sixth and seventh steps. In this case, the seventh step is performed to pattern not only the insulating layer and the second conductive layer but also the metal layer.

In still another preferred embodiment of the method according to the second aspect, a step of forming a metal layer on the second conductive layer and a step of forming a silicide layer on the second conductive layer using the metal layer thus formed are additionally provided between the sixth and seventh steps. In this case, the seventh step is performed to pattern not only the insulating layer and the second conductive layer but also the metal and silicide layers.

BRIEF DESCRIPTION OF THE DRAWINGS

In order that the present invention maybe readily carried into effect, it will now be described with reference to the accompanying drawings.

FIGS. 4A to 4F are cross-sectional views showing the process step sequence of a fabrication method of the semiconductor memory device according to the first embodiment, respectively.

DETAILED DESCRIPTION OF THE PREFERRED EMBODIMENTS

Figure 1A:
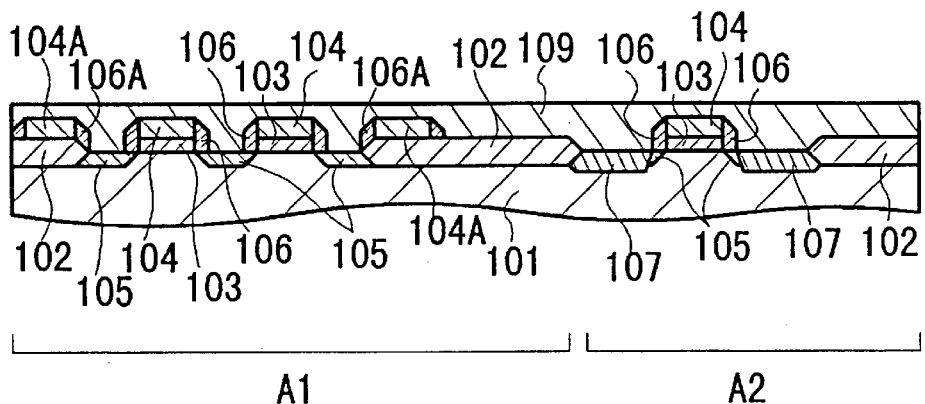
FIGS. 1A to 1F are cross-sectional views showing the process step sequence of a conventional fabrication method of a semiconductor memory device, respectively.
Figure 1B:
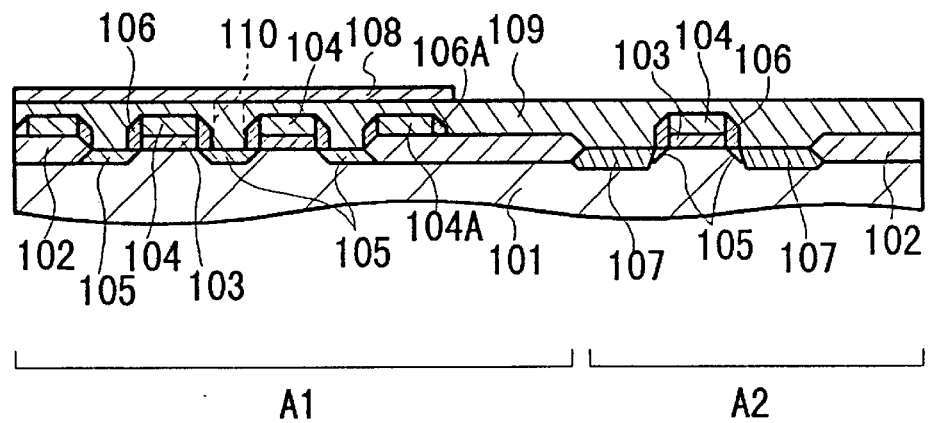
Figure 1C:
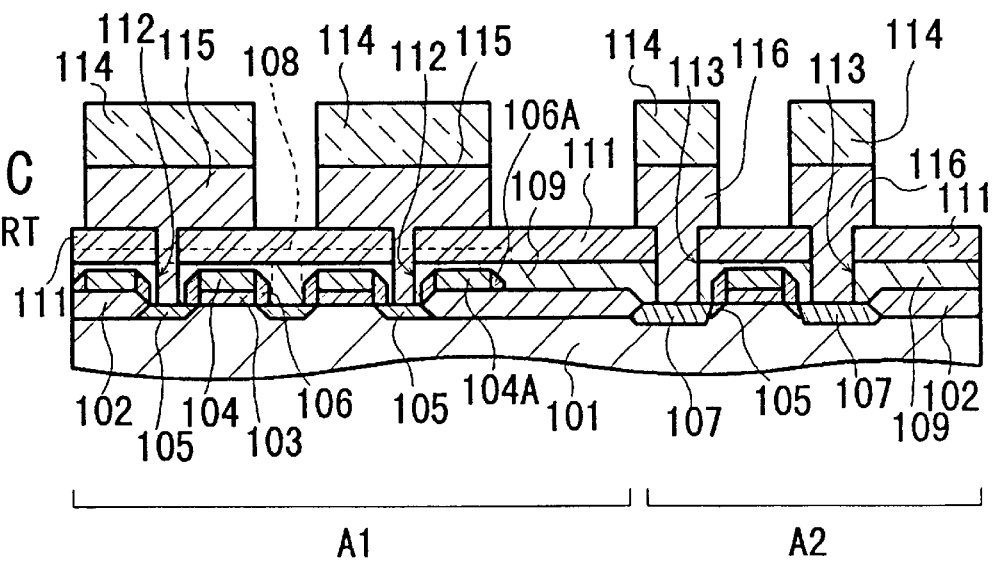

Preferred embodiments of the present invention will be described below referring to the drawings attached.

FIRST EMBODIMENT

A DRAM according to a first embodiment includes a memory cell area and a peripheral circuit area on a semiconductor substrate. The memory cell area has memory cells arranged in a matrix array, bit lines, and word lines. Each of the memory cells has a MOSFET and a stacked capacitor. The bit lines are electrically connected to the respective MOSFETs. The word lines are electrically connected to gate electrodes of the respective MOSFETs. The peripheral circuit area has logic circuits for driving the memory cells. The logic circuits include MOSFETs.

Figure 3:
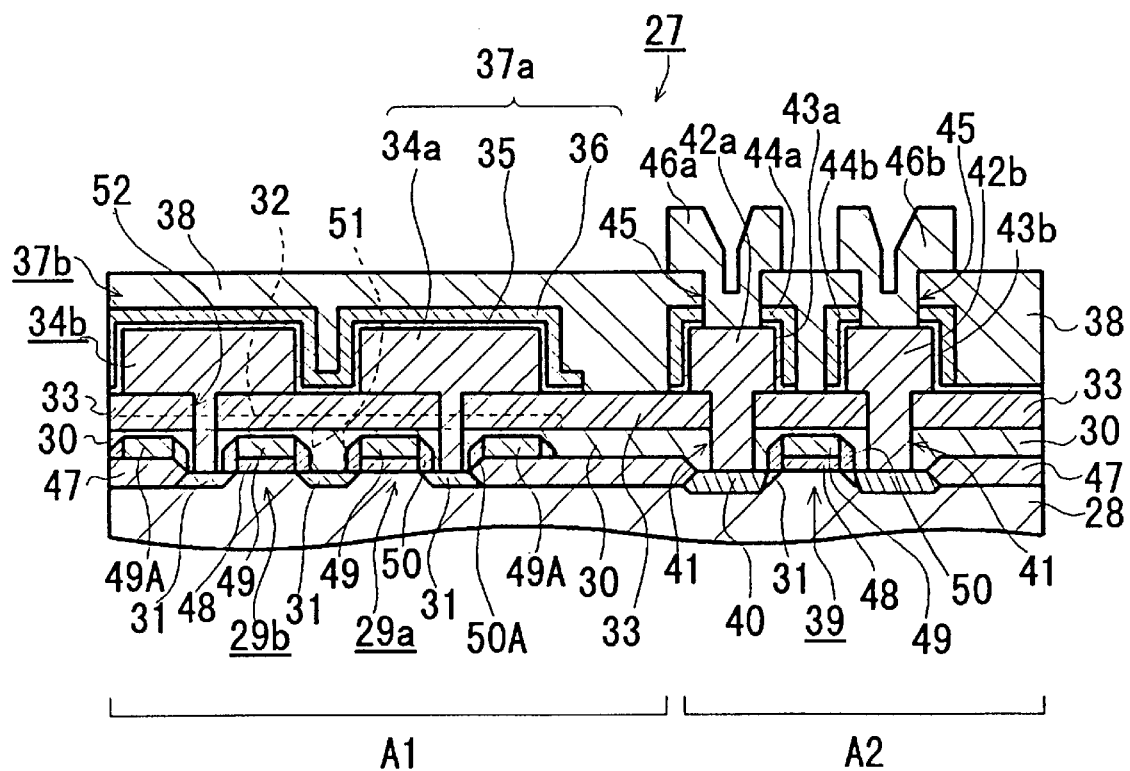
FIG. 3 is a cross-sectional view showing a semiconductor memory device according to a first embodiment of the present invention.

Here, as shown in FIG. 3, only two MOSFETs 29a and 29b and only two corresponding capacitors 37a and 37b located in the memory cell area A1 and only one MOSFET 39 located in the peripheral circuit area A2 are explained here for the sake of simplification of description.

In FIG. 3, a field oxide layer 47 is selectively formed on a main surface of a p-type single-crystal silicon (Si) substrate 28, thereby defining an active region for the MOSFETs 29a and 29b in the memory cell area A1 and another active region for the MOSFET 39 in the peripheral circuit area A2.

In the active region of the memory cell area A1, three $n^-$-type diffusion regions 31 are formed in the surface area of the substrate 28. One of the regions 31 located at the center is commonly used as a source/drain region of the MOSFETs 29a and 29b. Two ones of the regions 31 located at the right- and left-hand sides are used as source/drain regions of the respective MOSFETs 29a and 29b.

In the active region of the peripheral circuit area A2, two $n^-$-type diffusion regions 31 and two $n^+$-type diffusion regions 40 are formed in the surface area of the substrate 28, which are respectively used as source/drain regions of the MOSFET 39. These regions 31 and 40 constitute a Lightly-Doped Drain (LDD) structure.

Each of the MOSFETs 29a and 29b has a gate oxide layer 48 formed on the exposed main surface of the substrate 28 in the memory cell area A1, a gate electrode 49 formed on the layer 48, and two sidewall spacers 50 formed on the exposed main surface of the substrate 28 at both sides of the gate electrode 49. Two gate electrodes 49A and two sidewall spacers 50A are formed on the field oxide layer 47. These electrodes 49A are used for interconnection conductors.

The MOSFET 39 has a gate oxide layer 48 formed on the exposed main surface of the substrate 28 in the peripheral circuit area A2, a gate electrode 49 formed on the layer 48, and two sidewall spacers 50 formed on the exposed main surface of the substrate 28 at both sides of the gate electrode 49.

A first interlayer insulating layer 30 is formed to cover the gate electrodes 49 and 49A and the sidewall spacers 50 and 50A over the entire substrate 28. A bit line 32 is formed on the layer 30 and is electrically connected to the underlying $n^-$-diffusion region 31 located between the gate electrodes 49 through a contact hole 51 of the layer 30.

A second interlayer insulating layer 33 is formed on the first interlayer insulating layer 30 over the entire substrate 28. The storage capacitors 37a and 37b are formed on the layer 33 in the memory cell area A1 to be stacked over the corresponding MOSFETs 29a and 29b. The capacitor 37a is made of a lower or storage electrode 34a made of polysilicon, a common dielectric 35 made of the combination of $SiO_2$ and $Si_3N_4$, and a common upper or cell-plate electrode 36 made of polysilicon. The capacitor 37b is made of a lower or storage electrode 34b made of polysilicon, the common dielectric 35, and the common upper or cell-plate electrode 36. The lower electrodes 34a and 34b are electrically connected to the corresponding $n^-$-type diffusion regions 31 located at the right- and left-hand sides through corresponding contact holes 52 penetrating the first and second interlayer insulating layers 30 and 33.

In the peripheral circuit area A2, two contact pads 42a and 42b, which are made of the same polysilicon as that used for forming the lower electrodes 34a and 34b of the capacitors 37a and 37b, are formed in corresponding contact holes 41 vertically penetrating the second and first interlayer insulating layers 33 and 30. The bottoms of the contact pads 42a and 42b are contacted with and electrically connected to the respective n⁻-type diffusion regions 40 through the corresponding contact holes 41.

Further, the upper parts of the contact pads 42a and 42b protrude from the second interlayer insulating layer 33 and are covered with pad insulating layers 43a and 43b, respectively. The insulating layers 43a and 43b are made of the same dielectric material as that used for forming the common dielectric 35 of the capacitors 37a and 37b. The insulating layers 43a and 43b are further covered with pad protection layers 44a and 44b, respectively. The pad protection layers 44a and 44b are made of the same polysilicon as that used for forming the common upper electrode 36 of the capacitors 37a and 37b.

The pad insulating layers 43a and 43b are separated from each other in a space between the contact pads 42a and 42b. The pad protection layers 44a and 44b are also separated from each other in the space and therefore, these layers 44a and 44b are electrically disconnected from each other.

The pad protection layers 44a and 44b are entirely located on the corresponding pad insulating layers 43a and 43b and therefore, the layers 44a and 44b are not contacted with the underlying second interlayer insulating layer 33 and the corresponding contact pads 42a and 42b.

A third interlayer insulating layer 38 is formed to cover the storage capacitors 37a and 37b, the contact pads 42a and 42b, the pad insulating layers 43a and 43b, and the pad protection layers 44a and 44b over the entire substrate 28. Two contact holes 45 are formed to vertically penetrate the third interlayer insulating layer 38, the pad protection layers 44a and 44b, and the pad insulating layers 43a and 43b. The holes 45 expose the tops of the corresponding contact pads 42a and 42b. The pad protection layers 44a and 44b are electrically insulated from each other by the third interlayer insulating layer 38.

Aluminum wiring conductors 46a and 46b are formed on the third interlayer insulating layer 38 to be contacted with and electrically connected to the respective contact pads 42a and 42b through the corresponding contact holes 45.

Next, a fabrication method of the DRAM according to the first embodiment is explained below with reference to FIGS. 4A to 4F.

Figure 4A:
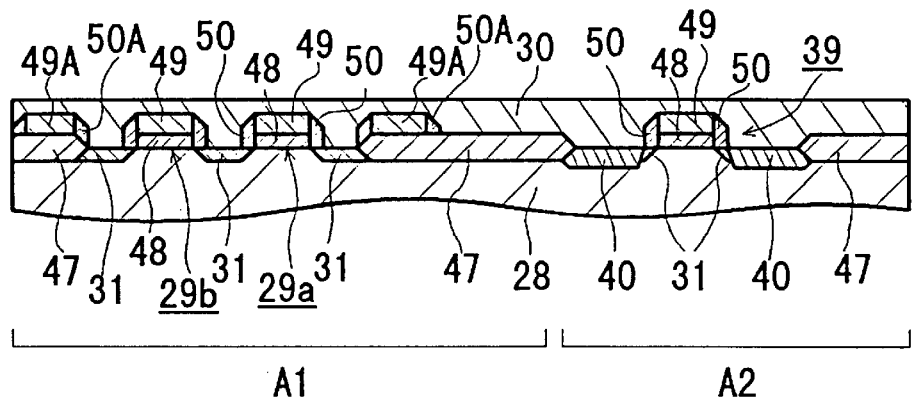

First, as shown in FIG. 4A, a $Si_3N_4$ layer (not shown) is formed on the main surface of the p-type silicon substrate 28 and is patterned by photolithography and etching processes, thereby selectively leaving the $Si_3N_4$ layer at the locations corresponding to the active regions. Then, by a popular LOCOS process, the field oxide layer 47 with a thickness of approximately 300 nm is selectively formed on the main surface of the substrate 28, thereby defining the active regions in the memory cell area A1 and the peripheral circuit area A2. The main surface of the substrate 28 is exposed from the field oxide layer 47 in the active regions.

Next, after removing the remaining $Si_3N_4$ layer, the gate oxide layers 48 with a thickness of approximately 10 to 12 nm are selectively formed on the exposed main surface of the substrate 28 in the respective active regions by a thermal oxidation process. A polysilicon layer (not shown) with a thickness of approximately 100 nm and a tungsten silicide ($WSi_2$) layer (not shown) with a thickness of approximately 100 nm are then formed to be stacked over the entire substrate 28. The polysilicon layer and the $WSi_2$ layer are then patterned to form gate electrodes 49 and 49A on the corresponding gate oxide layers 48 and the field oxide layer 47, respectively.

Subsequently, using the gate electrodes 49 and the field oxide layer 47 as a mask, the active regions of the substrate 28 are selectively ion-implanted with phosphorus (P) at an acceleration energy of approximately 40 keV with a dose of approximately $2 \times 10^{13}$ atoms/cm², thereby forming the n⁻-type diffusion regions 31. Then, a HTO layer of silicon with a thickness of approximately 100 nm is formed over the entire substrate 28 by a LPCVD process at a temperature of approximately 800° C. using silane ($SiH_4$) and nitrogen monoxide ($N_2O$) as a source gas. The HTO layer thus formed is then etched back by a reactive ion etching process, thereby forming the sidewall spacers 50 and 50A.

In the reactive ion etching process, for example, the applied electric power is set as 250 W, and the degree of vacuum is set as 700 mTorr. Argon (Ar) is used as the carrier gas, and trifluoromethane ($CHF_3$) and tetrafluoromethane ($CF_4$) are used as the etching gas. The flow rate ratio of these gasses are set as $CHF_3$: $CF_4$: Ar=40 sccm: 40 sccm: 800 sccm.

Next, using a patterned photoresist film (not shown), the sidewall spacers 50 and the gate electrodes 49 as a mask, the active regions of the substrate 28 in the peripheral circuit area A2 are selectively ion-implanted with arsenic (As) with a dose of approximately $3 \times 10^{15}$ atoms/cm², thereby forming the n⁺-type diffusion regions 40. Thus, the LDD structures are formed in the active regions for the n-channel MOSFETs in the peripheral circuit area A2.

After removing the above patterned photoresist film, using another patterned photoresist film (not shown) which covers the memory cell area A1 and the active regions for the n-channel MOSFETs thus formed, the sidewall spacers 50, and the gate electrodes 49 as a mask, the remaining active regions of the substrate 28 in the peripheral circuit area A2 are selectively ion-implanted with boron difluoride ($BF_2$) with a dose of approximately $3 \times 10^{15}$ atoms/cm², thereby forming p-channel MOSFETs (not shown) in the peripheral circuit area A2.

Following this, a HTO layer of silicon (not shown) with a thickness of approximately 100 nm is formed to cover the gate electrodes 49 and 49A and the sidewall spacers 50 and 50A over the entire substrate 28 by a LPCVD process at a high temperature. Subsequently, a BPSG layer (not shown) with a thickness of approximately 300 nm is formed on the HTO layer thus formed over the entire substrate 28 by a LPCVD process where TEOS ($Si(OC_2H_5)_4$), phosphine ($PH_3$), trimethyl borate ($B(OCH_3)_3$), and oxygen ($O_2$) are used as a source gas. The BPSG layer is then reflown at a temperature of 750° to 900° C. to thereby planarize its surface. The combination of the HTO layer and the BPSG layer thus formed serves as the first interlayer insulating layer 30. The state at this stage is shown in FIG. 4A.

The HTO layer is provided for the purpose of ensuring the step coverage of the first interlayer insulating layer 30 with respect to the gate electrodes 49 and 49A and for the purpose of preventing the phosphorus and boron atoms contained in the BPSG layer from diffusing into the underlying diffusion regions 31 and 40.

Figure 4B:
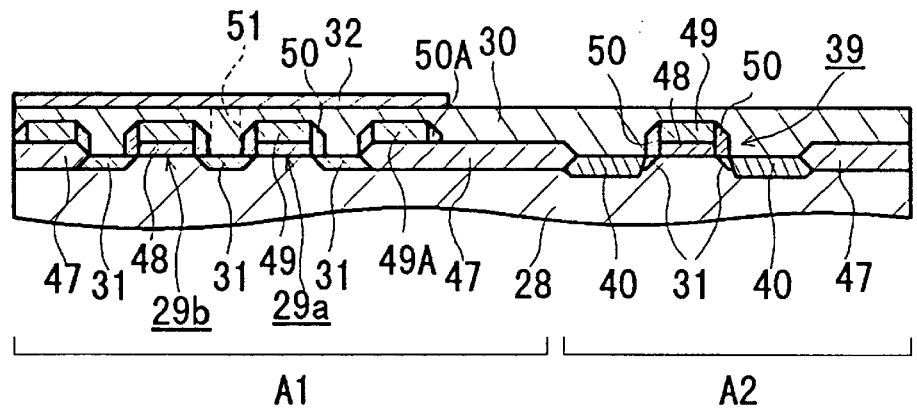

Further, to form the contact hole 51 vertically extending to the corresponding one of the n⁻-type diffusion regions 31 in the memory cell area A1, as shown in FIG. 4B, the first interlayer insulating layer 30 is selectively etched by an anisotropically etching process using an etching gas of the fluoro-carbon system, (for example, $CHF_3$ or $CF_4$).

An n⁺-type polysilicon layer with a thickness of approximately 100 nm and a $WSi_2$ layer with a thickness of approximately 100 nm are successively formed on the first interlayer insulating layer 30, thereby forming a composite layer with a polycide structure. The composite layer is then patterned to thereby form the bit line 32 which is contacted with and electrically connected to the underlying n-type diffusion region 31 through the contact hole 51 of the layer 30 in the memory cell area A1. The state at this stage is shown in FIG. 4B.

Subsequently, a HTO layer of silicon (not shown) with a thickness of approximately 100 nm is formed on the first interlayer insulating layer 30 to cover the bit line 32 over the entire substrate 28 by a LPCVD process at a high temperature. Then, a BPSG layer (not shown) with a thickness of approximately 300 nm is formed on the HTO layer thus formed over the entire substrate 28 by a LPCVD process. The BPSG layer is then reflown at a high temperature to thereby planarize its surface.

Figure 4C:
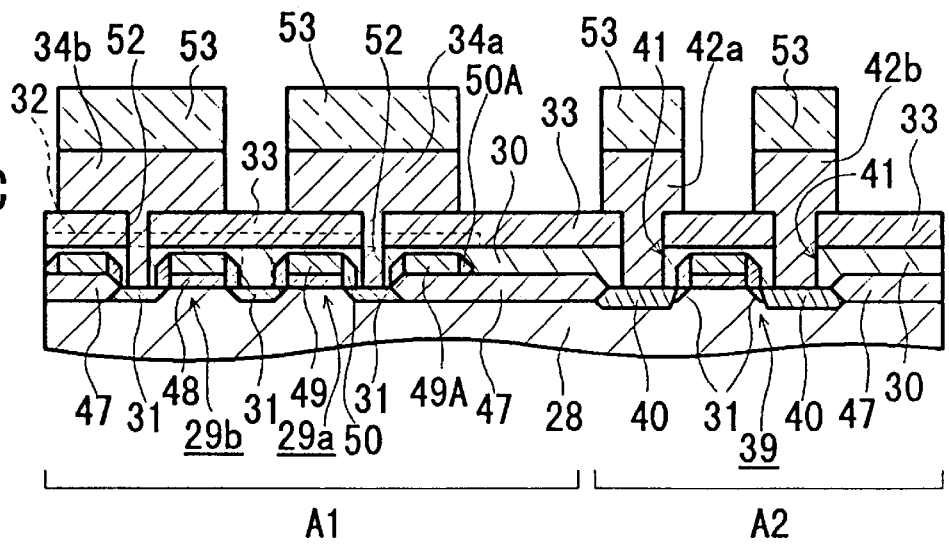

The combination of the HTO layer and the BPSG layer thus formed serves as the second interlayer insulating layer 33 as shown in FIG. 4C.

The height of the second interlayer insulating layer 23 from the main surface of the substrate 28 is approximately 800 nm.

Further, the second and first interlayer insulating layers 33 and 30 are selectively etched by photolithography and etching processes, thereby forming the contact holes 52 in the memory cell area A1 and the contact holes 41 in the peripheral circuit area A2. As shown in FIG. 4C, the contact holes 52 are positioned at the corresponding locations to the n-type diffusion regions 31 placed at the right- and left-hand sides, respectively. The contact holes 41 are positioned at the corresponding locations to the $n^+$-type diffusion regions 40, respectively.

To form lower or storage electrodes 34a and 34b of the capacitors 37a and 37b in the memory cell area A1 and the contact pads 42 in the peripheral circuit area A2, a first polysilicon layer with a thickness of approximately 600 nm is deposited on the second interlayer insulating layer 111 by a CVD process.

Further, using a patterned photoresist film (not shown) covering the entire memory cell area A1 and a part of the peripheral circuit area A2 where the $p^+$-type diffusion regions (not shown) are formed, the first polysilicon layer thus formed is then selectively ion-implanted with phosphorus at an acceleration energy of 40 keV with a dose of approximately $1 \times 10^{16}$ atoms/cm$^2$. After removing the above photoresist film, another photoresist film (not shown) covering the entire memory cell area A1 and another part of the peripheral circuit area A2 where the $n^-$-type diffusion regions 40 are formed, the first polysilicon layer thus formed is selectively ion-implanted with boron at an acceleration energy of 30 keV with a dose of approximately $1 \times 10^{16}$ atoms/cm$^2$.

Subsequently, as shown in FIG. 4C, using a patterned photoresist film 53 as a mask, the first polysilicon layer thus ion-implanted twice is selectively etched by an anisotropically etching process Thus, the lower or storage electrodes 34a and 34b for the capacitors 37a and 37b are formed in the memory cell area A1 and at the same time, the contact pads 42a and 42b for the $n^+$-type diffusion regions 40 and the contact pads (not shown) for the $p^+$-type diffusion regions are formed in the peripheral area A2. The state at this stage is shown in FIG. 4C. Thereafter, the photoresist film 53 is removed.

To form the common dielectric 35 of the capacitors 37a and 37b and the pad insulating layers 43a and 43b for the contact pads 42a and 42b, a $Si_3N_4$ layer with a thickness of approximately 6 nm is deposited on the lower electrodes 34a and 34b, the contact pads 42a and 42b, and the exposed second interlayer insulating layer 33 over the entire substrate 28. The $Si_3N_4$ layer is then oxidized in a steam atmosphere at a temperature of 850° C. for 30 minutes to thereby form a $SiO_2$ layer with a thickness of approximately 1 nm in the surface area of the $Si_3N_4$ layer.

Following this, to form the common upper or cell-plate electrode 36 of the capacitors 37a and 37b and the pad protection layers 44a and 44b for the contact pads 42a and 42b, a second polysilicon layer with a thickness of approximately 200 nm, which is doped with phosphorus, is formed on the $SiO_2$ layer over the entire substrate 28 by a popular CVD process.

Subsequently, using a patterned photoresist film 54 formed on the second polysilicon layer as a mask, the n-type second polysilicon layer and the underlying $Si_3N_4$ and $SiO_2$ layers are selectively etched. Thus, the common upper electrode 36 of the capacitors 37a and 37b is formed by the remaining second polysilicon layer in the memory cell area A1. The common dielectric 35 of the capacitors 37a and 37b are formed by the combination of the $Si_3N_4$ and $SiO_2$ layers in the memory cell area A1. The pad protection layers 44a and 44b are formed by the remaining second polysilicon layer in the peripheral circuit area A2. The pad insulating layers 43a and 43b for the contact pads 42a and 42b are formed by the combination of the $Si_3N_4$ and $SiO_2$ layers in the peripheral circuit area A2. The state at this stage is shown in FIG. 4D.

At this stage, the capacitors 37a and 37b with the stacked structure are formed in the memory cell area A1.

Figure 1D:
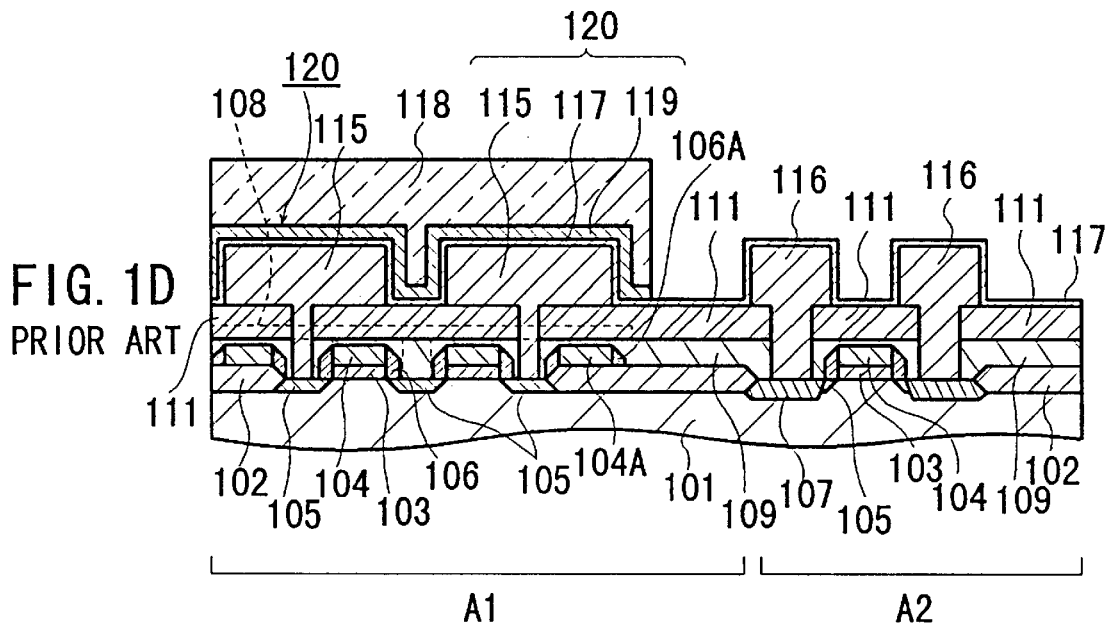
Figure 1E:
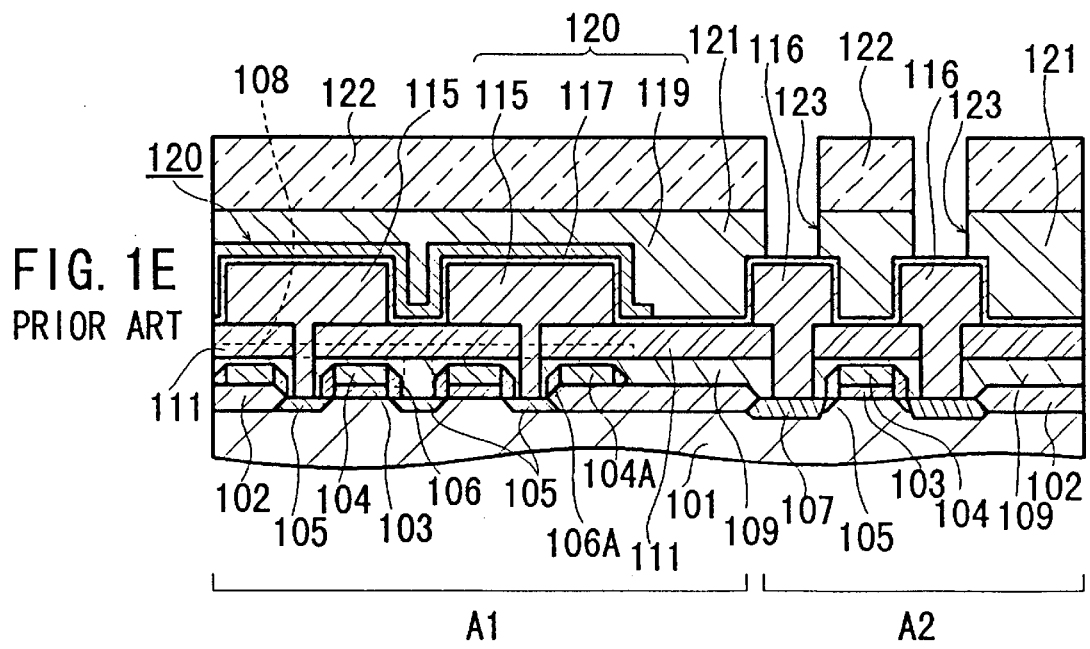
Figure 1F:
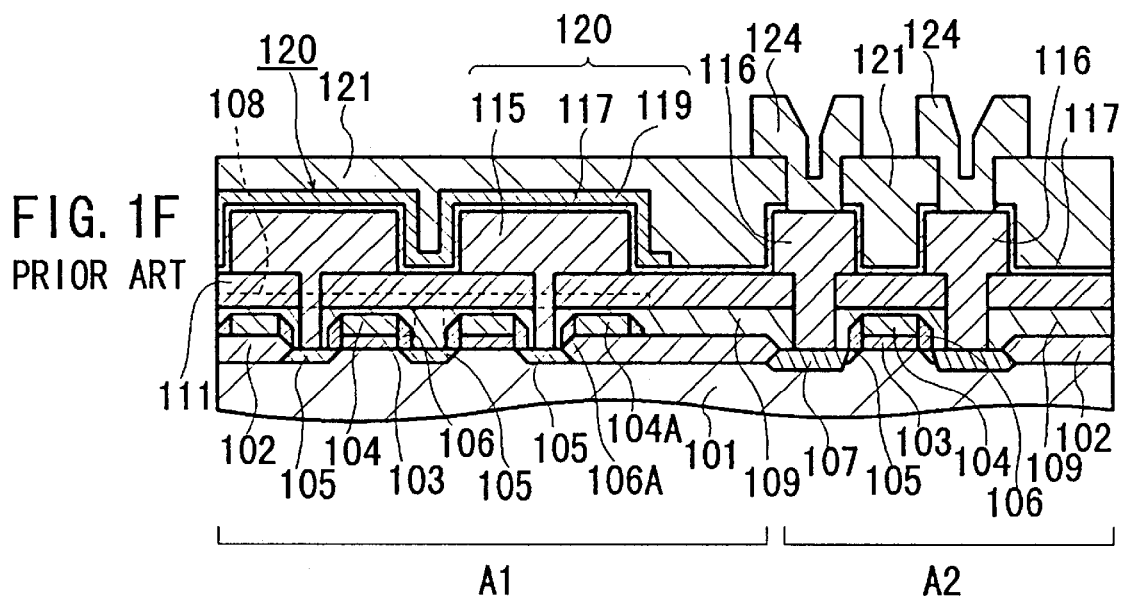
Figure 2A:
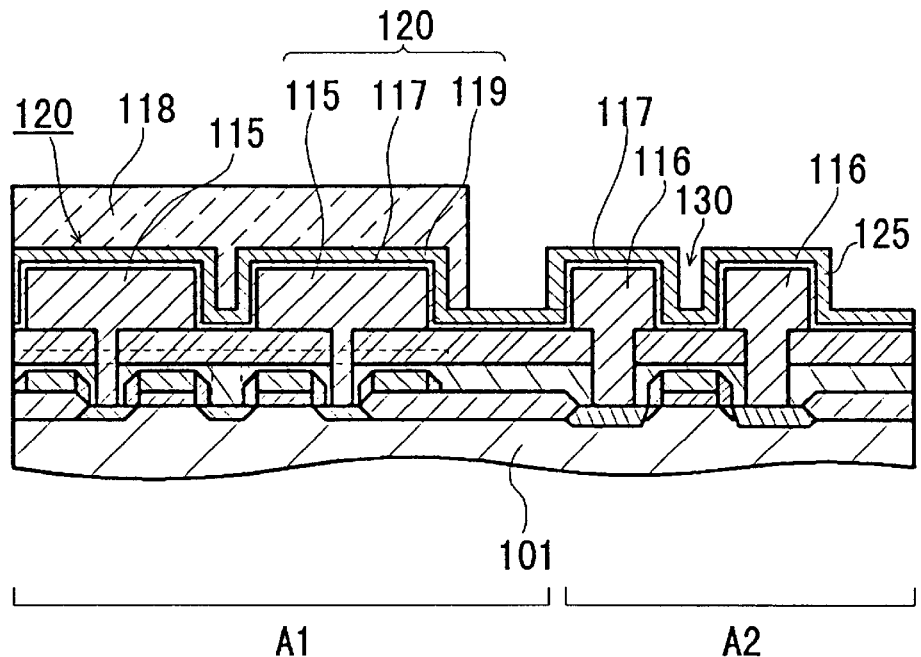
FIG. 2A is a cross-sectional view during the etching process of the polysilicon layer for the common upper or cell-plate electrode of the capacitors in the conventional fabrication method shown in FIGS. 1A to 1F.
Figure 2B:
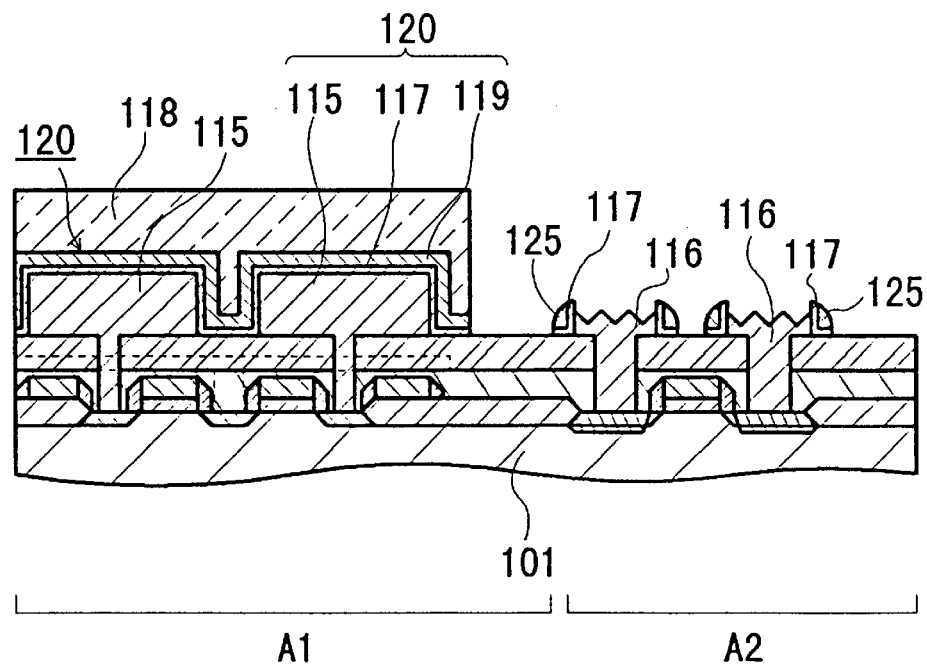
FIG. 2B is a cross-sectional view showing the damage of the contact pads in the peripheral area in the conventional fabrication method shown in FIGS. 1A to 1F.

Since the contact pads 42a and 42b in the peripheral circuit area A2 are formed by the same polysilicon layer as that of the lower or storage electrodes 34a and 34b, the height of the pads 42a and 42b is the same as that of the electrodes 34a and 34b, as shown in FIG. 1D. Similarly, since the pad insulating layers 43a and 43b in the peripheral circuit area A2 are formed by the same combination of the $Si_3N_4$ and $SiO_2$ layers as that of the common dielectric 35, the level of the pads 42a and 42b is the same as that of the electrodes 34a and 34b. Since the pad protection layers 44a and 44b in the peripheral circuit area A2 are formed by the same polysilicon layer as that of the common upper or cell-plate electrode 36, the level of the layers 44a and 44b is the same as that of the electrode 36.

After removing the patterned photoresist film 54, to form the third interlayer insulating layer 38, a HTO layer of silicon (not shown) is formed on the second interlayer insulating layer 33 over the entire substrate 28 by a LPCVD process at a high temperature. Then, a BPSG layer (not shown) is formed on the HTO layer thus formed over the entire substrate 28 by a LPCVD process. The BPSG layer is then reflown at a high temperature to thereby planarize its surface. The combination of the HTO layer and the BPSG layer thus formed serves as the third interlayer insulating layer 38, as shown in FIG. 4E.

The height of the third interlayer insulating layer 38 from the main surface of the substrate 28 is approximately 1200 nm.

The HTO layer is provided for the purpose of ensuring the step coverage of the third interlayer insulating layer 38 with respect to the common upper electrode 36 and for the purpose of preventing the phosphorus and boron atoms contained in the BPSG layer from diffusing into the underlying common upper electrode 36 and pad protection layers 44a and 44b.

Further, to form contact holes 45A in the third interlayer insulating layer 38, using a patterned photoresist film 55 formed on the third interlayer insulating layer 38 as a mask, the third interlayer insulating layer 38 is selectively etched by an anisotropic etching process by using an etching gas of the fluorocarbon system (for example, $CHF_3$ or $CF_4$). This anisotropic etching process is performed by, for example, a reactive ion etching process under the following condition.

Specifically, the applied electric power is set as 8500 W, and the degree of vacuum is set as 400 mTorr. Argon (Ar) is used as the carrier gas, and trifluoromethane ($CHF_3$) and tetrafluoromethane ($CF_4$) are used as the etching gas. The flow rate ratio of these gasses are set as $CHF_3$: $CF_4$: Ar=30 sccm: 10 sccm: 450 sccm.

Following this anisotropic etching process, the pad protection layers 44a and 44b are selectively etched by using the gaseous mixture of chlorine ($Cl_2$) and hydrogen bromide (HBr) as an etching gas in the contact holes 45A. This etching process is for example, a reactive ion etching process performed under the following conditions. The applied electric power is set as 400 W, and the degree of vacuum is set as 100 mTorr. The flow rate ratio of these gasses are set as $Cl_2$: HBr 80 sccm: 30 sccm.

Further, the pad insulating layers 43a and 43b are selectively etched in the contact holes 45A by an anisotropically etching process using an etching gas of the fluoro-carbon system (for example, $CHF_3$ or $CF_4$). Thus, the contact holes 45 exposing the tops of the corresponding contact pads 42a and 42b are formed to vertically penetrate the third interlayer insulating layer 38, the pad protection layers 44a and 44b, and the pad insulating layers 43a and 43b in the peripheral circuit area A2. As shown in FIG. 4E, the contact holes 45 are positioned on the corresponding contact pads 42a and 42b, respectively.

Finally, after removing the photoresist film 55, an aluminum (Al) layer is formed on the third interlayer insulating layer 38 and is patterned by known processes, thereby forming the wiring conductors 46a and 46b. As shown in FIG. 3, the conductors 46a and 46b are contacted with and electrically connected to the corresponding contact pads 42a and 42b through the contact holes 45. Since the contact pads 42a and 42b are contacted with and electrically connected to the underlying diffusion regions 40 through the corresponding contact holes 41, the wiring conductors 46a and 46b are electrically connected to the corresponding diffusion regions 40.

Thus, the DRAM 27 with the stacked-capacitor structure according to the first embodiment of FIG. 3 is finished.

With the DRAM 27 according to the first embodiment, when the first polysilicon layer for forming the common upper or cell-plate electrode 36 of the capacitors 37a and 37b is selectively etched away in the peripheral circuit area A2 (see FIG. 4D), no only the part of the first polysilicon layer located in the memory cell area A1 but also the part of the first polysilicon layer located in the peripheral circuit area A2 are able to be covered with the photoresist film 55.

Therefore, unlike the conventional fabrication method shown in FIGS. 1A to 1F where the part of the first polysilicon layer in the peripheral circuit area A2 is exposed from the photoresist film 118 (see FIG. 1D), no special etching condition such as a high selection ratio of 100 or higher is required for the etching process for forming the electrode 36. This means that this etching process is readily and simply performed.

Also, the contact pads 42a and 42b are covered with the photoresist film 55, the pad protection layers 44a and 44b, and the pad insulating layers 43a and 43b in the process step of FIG. 4D. Accordingly, even if the etching period is excessively long, there arises no danger that the contact pads 42a and 42b are broken or damaged due to the etching action. This means that the problem in the conventional DRAM is able to be solved.

Further, similar to the conventional DRAM, it is needless to say that the following advantages are obtained in the DRAM 27 according to the first embodiment. Specifically, the Al wiring conductors 46a and 46b are easy to be formed because the surface of the third interlayer insulating layer 38 has been planarized. The Al wiring conductors 46a and 46b do not tend to electrically disconnect to the corresponding diffusion regions 40 within the contact holes 45.

In the DRAM 27 according to the first embodiment, the lower or storage electrodes 34a and 34b of the capacitors 37a and 37b and the contact pads 42a and 42b are made of polysilicon. However, tungsten (W), titanium (Ti), or titanium nitride (TiN) maybe used instead of polysilicon. Further, any multilayer structure may be used, which includes at least two stacked layers made of materials selected from at least two ones of W, Ti, and TiN instead of a polysilicon single layer.

SECOND EMBODIMENT

Figure 5:
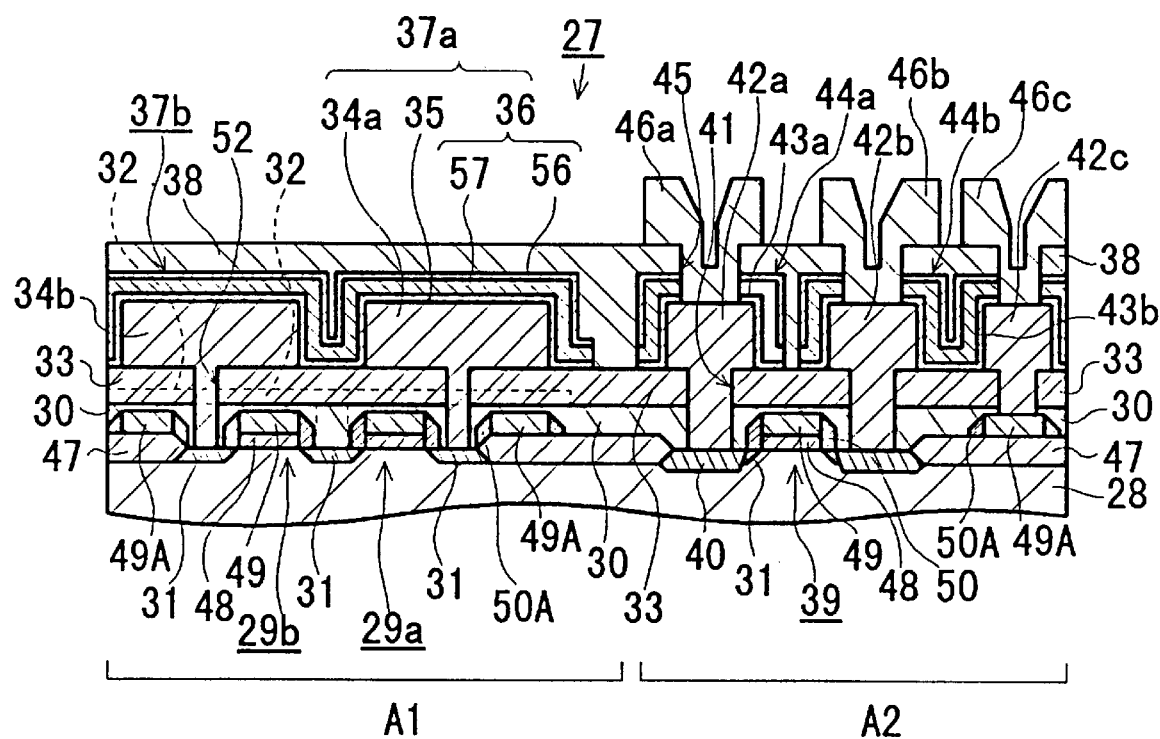
FIG. 5 is a cross-sectional view showing a semiconductor memory device according to a second embodiment of the present invention.

A DRAM according to a second embodiment is shown in FIG. 5. This DRAM has the same configuration as that of the first embodiment except for a layer for forming the cell-plate electrodes and the pad protection layers and for the configuration of the pad protection layers. Therefore, the explanation relating to the same configuration is omitted here for the sake of simplification by adding the same reference numerals to the corresponding elements.

Unlike in the DRAM according to the first embodiment of FIG. 3 where the common upper electrode 36 of the capacitors 37a and 37b and the pad protection layers 44a and 44b are made of polysilicon, they are made of a titanium silicide ($TiSi_2$) layer 56 and a polysilicon layer 57 in the second embodiment. In other words, they are made of a composite layer with a titanium polycide structure.

Further, in the peripheral circuit area A2, a contact pad 42c and an Al wiring conductor 46c are additionally formed to be contacted with and electrically connected to each other through an additional contact hole 45. Unlike in the DRAM according to the first embodiment of FIG. 3, the pad insulating layer 43b and the pad protection layer 44b are not disconnected (i.e., are continuous) between the contact pads 42b and 42c. In other words, the pad insulating layer 43b and the pad protection layer 44b are formed to be continuous between the contact pads 42b and 42c. Therefore, the contact pads 42b and 42c are electrically connected to each other through the pad protection layer 44b and the wiring conductors 46b and 46c.

The fabrication method of the DRAM according to the second embodiment is explained below with reference to FIGS. 4A, 4B, and 6A to 6E.

First, as shown in FIG. 4A, the field oxide layer 47 with a thickness of approximately 300 nm is selectively formed on the main surface of the substrate 28, thereby defining the active regions in the memory cell area A1 and the peripheral circuit area A2. The main surface of the substrate 28 is exposed from the field oxide layer 47 in the active regions.

Next, the gate oxide layers 48 with a thickness of approximately 10 to 12 nm are selectively formed on the exposed main surface of the substrate 28 in the respective active regions by a thermal oxidation process. A polysilicon layer (not shown) with a thickness of approximately 100 nm and a $WSi_2$ layer (not shown) with a thickness of approximately 100 nm are then formed to be stacked over the entire substrate 28. The polysilicon layer and the $WSi_2$ layer are then patterned to form the gate electrodes 49 and 49A on the corresponding gate oxide layers 48 and the field oxide layer 47, respectively.

Subsequently, using the gate electrodes 49 and the field oxide layer 47 as a mask, the active regions of the substrate 28 are selectively ion-implanted with phosphorus at an acceleration energy of approximately 40 keV with a dose of approximately $2 \times 10^{13}$ atoms/cm$^2$, thereby forming the n$^-$-type diffusion regions 31. Then, a $SiO_2$ layer is formed over the entire substrate 28 and is etched back, thereby forming the sidewall spacers 50 and 50A.

Next, the active regions of the substrate 28 in the peripheral circuit area A2 are selectively ion-implanted with arsenic, thereby forming n$^+$-type diffusion regions 40. Thus, LDD structures are formed in the active regions for the n-channel MOSFETs in the peripheral circuit area A2. The remaining active regions of the substrate 28 in the peripheral circuit area A2 are selectively ion-implanted with boron, thereby forming p-channel MOSFETs (not shown) in the peripheral circuit area A2.

Following this, a HTO layer of silicon (not shown) with a thickness of approximately 100 nm is formed to cover the gate electrodes 49 and 49A and the sidewall spacers 50 and 50A over the entire substrate 28 by a LPCVD process at a high temperature. Subsequently, a BPSG layer (riot shown) with a thickness of approximately 300 nm is formed on the HTO layer thus formed over the entire substrate 28 by a LPCVD process where TEOS ($Si(OC_2H_5)_4$), phosphine ($PH_3$), trimethyl borate ($B(OC_3)_3$), and oxygen ($O_2$) are used as a source gas. The BPSG layer is then reflown at a temperature of 750° to 900° C. to thereby planarize its surface. The combination of the HTO layer and the BPSG layer thus formed serves as the first interlayer insulating layer 30. The state at this stage is shown in FIG. 4A.

Further, to form the contact hole 51 vertically extending to the corresponding one of the n$^-$-type diffusion regions 31 in the memory cell area A1, as shown in FIG. 4B, the first interlayer insulating layer 30 is selectively etched by an anisotropically etching process using an etching gas of the fluorocarbon system (for example, $CHF_3$ or $CF_4$).

An n$^+$-type polysilicon layer with a thickness of approximately 100 nm and a WSi2 layer with a thickness of approximately 100 nm are successively formed on the first interlayer insulating layer 30, thereby forming a composite layer with a polycide structure. The composite layer is then patterned to thereby form the bit line 32 which is contacted with and electrically connected to the underlying n$^-$-type diffusion region 31 through the contact hole 51 of the layer 30 in the memory cell area A1. The state at this stage is shown in FIG. 4B.

Figure 6A:
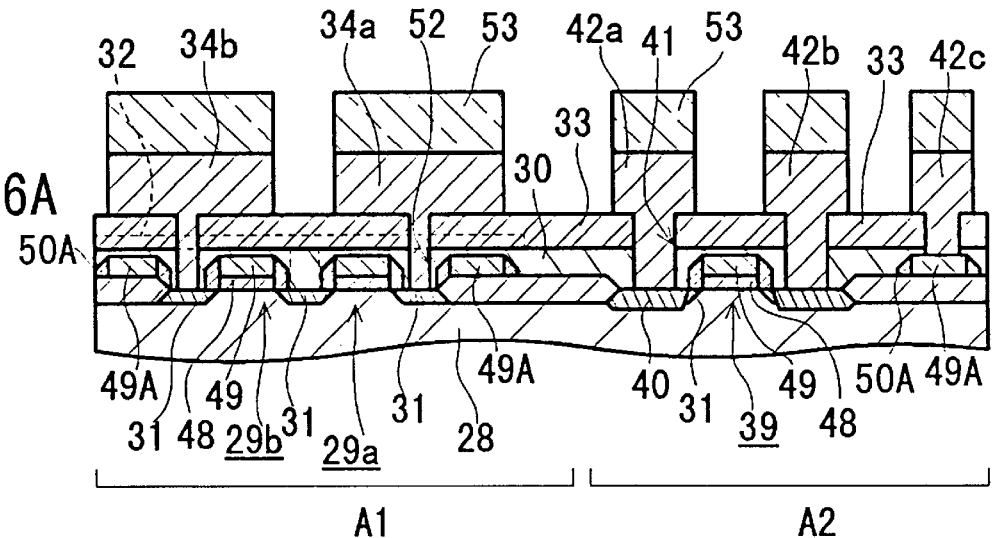
FIGS. 6A to 6E are cross-sectional views showing the process step sequence of a fabrication method of the semiconductor memory device according to the second embodiment, respectively.

Subsequently, to form the second interlayer insulating layer 33 as shown in FIG. 6A, a HTO layer of silicon (not shown) with a thickness of approximately 100 nm is formed on the first interlayer insulating layer 30 to cover the bit line 32 over the entire substrate 28 by a LPCVD process at a high temperature. Then, a BPSG layer (not shown) with a thickness of approximately 400 nm is formed on the HTO layer thus formed over the entire substrate 28 by a LPCVD process. The BPSG layer is then reflown at a temperature of 750° to 900° C. to thereby planarize its surface. The combination of the HTO layer and the BPSG layer thus formed serves as the second interlayer insulating layer 33.

The height of the second interlayer insulating layer 33 from the surface of the substrate 28 is approximately 800 nm.

Further, the second and first interlayer insulating layers 33 and 30 are selectively etched by photolithography and etching processes, thereby forming the contact holes 52 in the memory cell area A1 and the contact holes 41 in the peripheral circuit area A2 As shown in FIG. 6A, the contact holes 52 are positioned at the corresponding locations to the n$^-$-type diffusion regions 31 placed at the right- and left-hand sides, respectively. The contact holes 41 are positioned at the corresponding locations to the n$^+$-type diffusion regions 40, respectively.

To form lower or storage electrodes 34 of the capacitors 37a and 37b in the memory cell area A1 and the contact pads 42 in the peripheral circuit area A2, a first polysilicon layer with a thickness of approximately 600 nm is deposited on the second interlayer insulating layer 111 by a CVD process.

Further, using a patterned photoresist film (not shown) covering the entire memory cell area A1 and a part of the peripheral circuit area A2 where the p$^+$-type diffusion regions (not shown) are formed, the first polysilicon layer thus formed is then selectively ion-implanted with phosphorus at an acceleration energy of 40 keV with a dose of approximately $1 \times 10^{16}$ atoms/cm$^2$. After removing the above photoresist film, another photoresist film (not shown) covering the entire memory cell area A1 and another part of the peripheral circuit area A2 where the n$^+$-type diffusion regions 40 are formed, the first polysilicon layer thus formed is selectively ion-implanted with boron at an acceleration energy of 30 keV with a dose of approximately $1 \times 10^{16}$ atoms/cm$^2$.

Subsequently, as shown in FIG. 6A, using the patterned photoresist film 53 as a mask, the first polysilicon layer thus ion-implanted twice is selectively etched by an anisotropically etching process. Thus, lower or storage electrodes 34a and 34b for the capacitors 37a and 37b are formed in the memory cell area A1 and at the same time, the contact pads 42a and 42b for the n$^+$-type diffusion regions 40 and the contact pads (not shown) for the p$^+$-type diffusion regions are formed in the peripheral area A2. The state at this stage is shown in FIG. 6A. Thereafter, the photoresist film 53 is removed.

To form the common dielectric 35 of the capacitors 37a and 37b and the pad insulating layers 43a and 43b for the contact pads 42a and 42b, a $Si_3N_4$ layer with a thickness of approximately 6 nm is deposited on the lower or storage electrodes 34a and 34b and the contact pads 42a and 42b and the exposed second interlayer insulating layer 33 over the entire substrate 28. The $Si_3N_4$ layer is then oxidized in a steam atmosphere at a temperature of 850° C. for 30 minutes to thereby form a $SiO_2$ layer with a thickness of approximately 1 nm in the surface area of the $Si_3N_4$ layer.

Following this, to form the common upper or cell-plate electrode 36 of the capacitors 37a and 37b and the pad protection layers 44a and 44b for the contact pads 42a and 42b, a second polysilicon layer with a thickness of approximately 200 nm, which is doped with phosphorus, is formed on the $SiO_2$ layer over the entire substrate 28 by a popular CVD process.

Figure 6B:
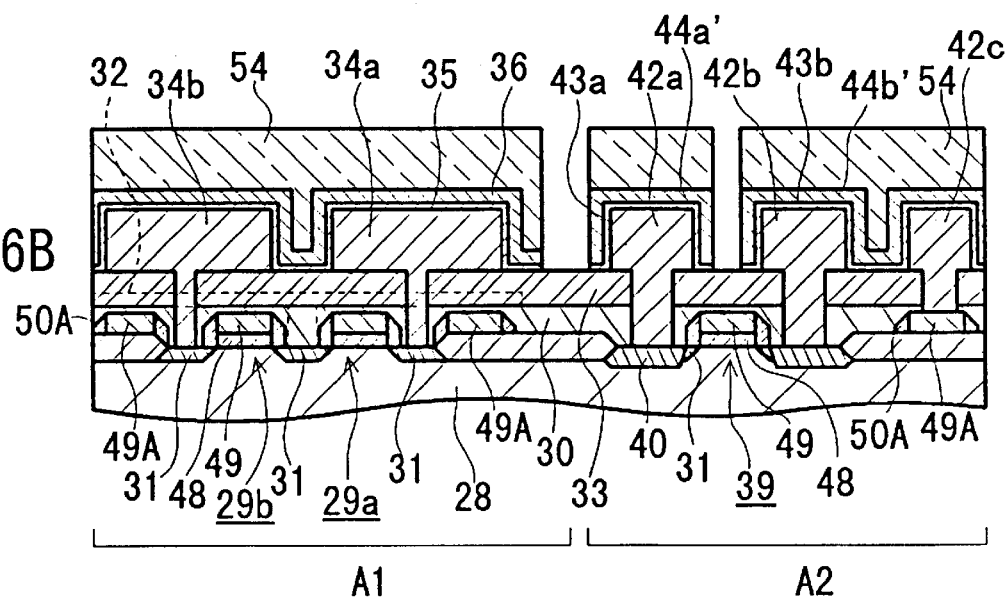
Figure 6C:
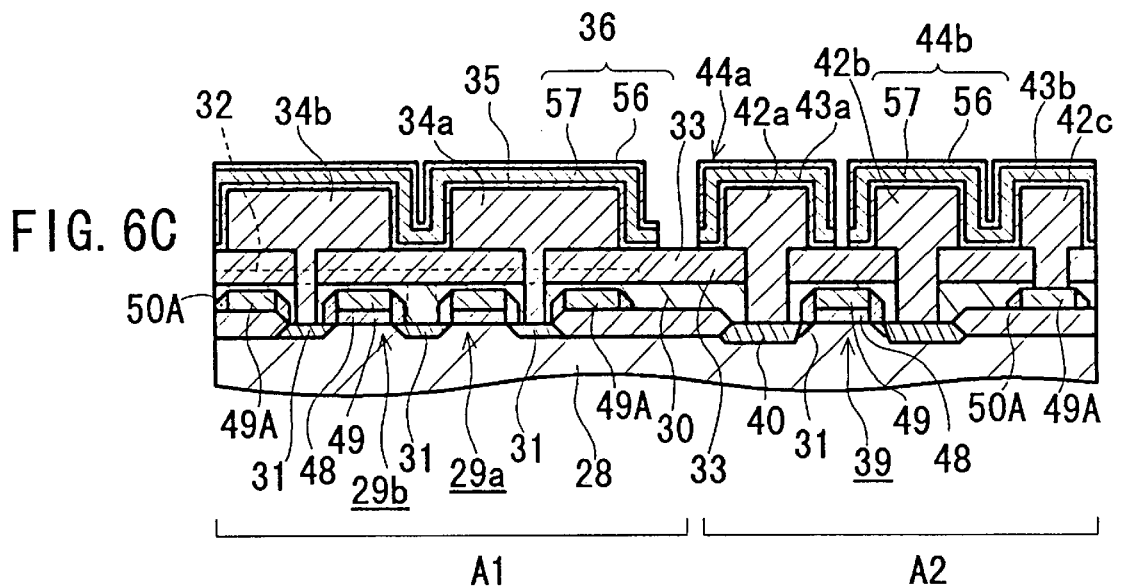

Subsequently, using a patterned photoresist film 54 formed on the second polysilicon layer as a mask, then-type second polysilicon layer and the underlying $Si_3N_4$ and $SiO_2$ layers are selectively etched. Thus, the common upper electrode 36 of the capacitors 37a and 37b is formed by the remaining second polysilicon layer in the memory cell area A1. The common dielectric 35 is formed by the combination of the $Si_3N_4$ layer and the $SiO_2$ layer in the memory cell area A1. The pad protection layers 44a and 44b are formed by the remaining second polysilicon layer in the peripheral circuit area A2. The insulating layers 43 for the contact pads 42a and 42b are formed by the combination of the $Si_2N_4$ layer and the $SiO_2$ layer in the peripheral circuit area A2. The state at this stage is shown in FIG. 6B.

At this stage, the capacitors 37a and 37b with the stacked structure are formed in the memory cell area A1.

After removing the patterned photoresist film 54, the surface of the second polysilicon layer is washed and then, the native oxide generated on the surface of the second polysilicon layer is removed by a wet etching process using a buffered hydrofluoric acid (BHF). Further, titanium (Ti) film with a thickness of approximately 100 nm is formed on the second polysilicon film over the entire substrate 28 by a sputtering process. The Ti layer and the second polysilicon layer are subjected to a Rapid Thermal Annealing (RTA) process using a lamp at a temperature of approximately 700° C. for approximately 30 seconds, thereby thermally reacting the both layers. Thus, the surface area of the second polysilicon layer is changed to be a titanium silicide ($TiSi_2$) layer 56. The remaining part of the second polysilicon layer is kept unchanged, resulting in the polysilicon layer 57.

In the area where no second polysilicon layer is placed, the second interlayer insulating layer 33 is exposed and therefore, no $TiSi_2$ is generated even if the Ti layer exists thereon.

Subsequently, the unreacted Ti layer remaining on the second interlayer insulating layer 33 is removed by using a mixture of ammonia ($NH_3OH$) and hydrogen peroxide ($H_2O_2$). Thus, the $TiSi_2$ layer 56 is selectively formed on the polysilicon layer 57, resulting in the titanium polycide structure.

The common upper or cell-plate electrodes 36 and the pad protection layers 44a and 44b has the composite structure made of the $TiSi_2$ layer 56 and the polysilicon layer 57, respectively. Since the sheet resistance of the $TiSi_2$ layer 56 is as low as 2 to 3 Ω, this layer 56 can be sufficiently used as a wiring or interconnection material for electrically connecting the adjacent contact pads 42b and 42c.

Figure 6D:
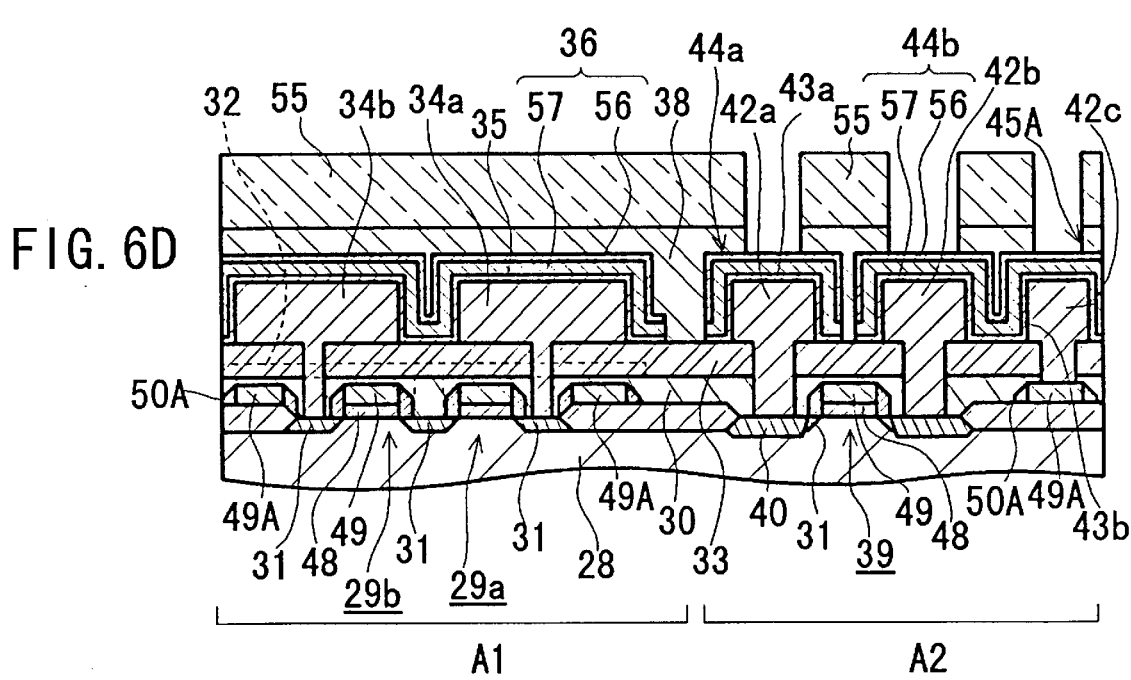

Thereafter, to form the third interlayer insulating layer 38, a $SiO_2$ layer (not shown) is formed on the second interlayer insulating layer 33 over the entire substrate 28 by a CVD process at a temperature of approximately 500° C. Then, a BPSG layer (not shown) is formed on the $SiO_2$ layer thus formed over the entire substrate 28 by a CVD process. The BPSG layer is then subjected to a RTA process at a temperature of approximately 800° C. for approximately 60 seconds and to a CMP process to thereby planarize its surface. The combination of the $SiO_2$ layer and the BPSG layer thus formed serves as the third interlayer insulating layer 38, as shown in FIG. 6D.

The height of the third interlayer insulating layer 38 from the main surface of the substrate 28 is approximately 1500 nm.

The $SiO_2$ layer is provided for the purpose of ensuring the step coverage of the third interlayer insulating layer 38 with respect to the common upper electrode 36 and for the purpose of preventing the phosphorus and boron atoms contained in the BPSG layer from diffusing into the underlying common upper electrode 36 and pad protection layers 44a and 44b.

Further, to form contact holes 45A exposing the pad protection layers 44a and 44b in the third interlayer insulating layer 38, using a patterned photoresist film 55 formed on the third interlayer insulating layer 38 as a mask, the third interlayer insulating layer 38 is selectively etched by an anisotropic etching process by using an etching gas of the fluoro-carbon system (for example, $CHF_3$ or $CF_4$). This anisotropic etching process is performed by, for example, a reactive ion etching process.

Following this anisotropic etching process, the pad protection layers 44a and 44b are selectively etched in the contact holes 45A. This etching process is for example, a reactive ion etching process performed under the following conditions. The applied electric power is set as 150 W, and the degree of vacuum is set as 250 mTorr. Helium (He) is used as a carrier gas. The gaseous mixture of sulfur hexafluoride ($SF_6$) and hydrogen bromide (HBr) is used as an etching gas. The flow rate ratio of these gasses are set as $SF_6$: HBr: He=50 sccm: 100 sccm: 150 sccm.

Figure 6E:
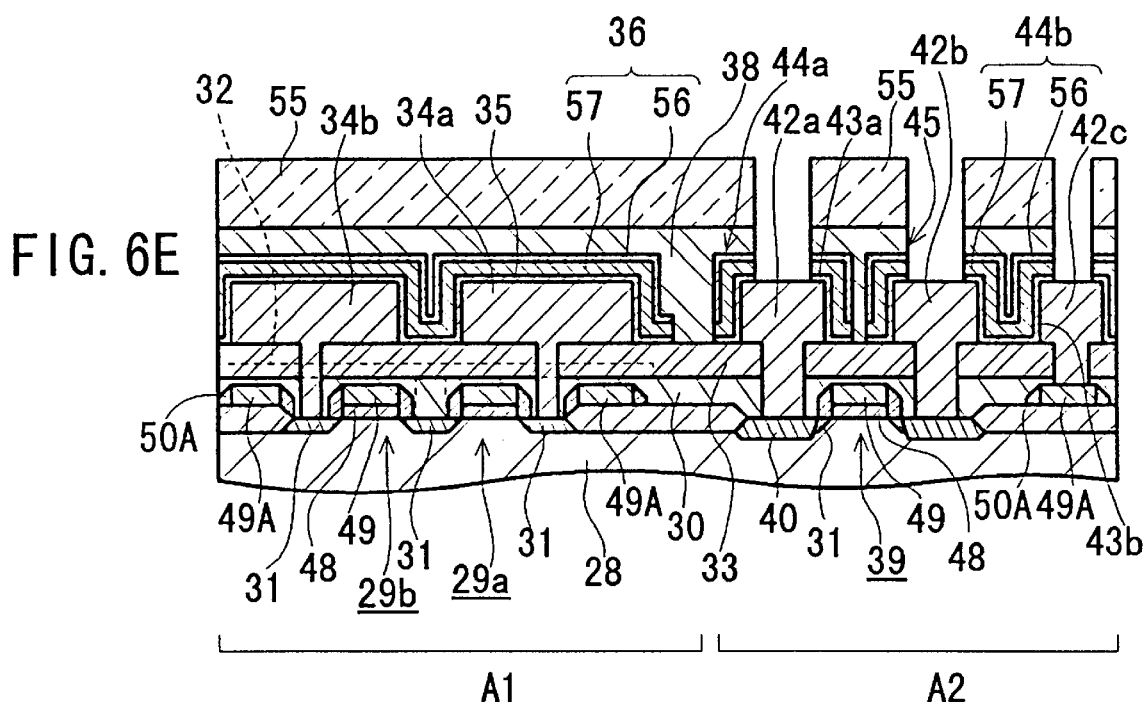

Further, the pad insulating layers 43a and 43b are selectively etched in the contact holes 45A by an anisotropically etching process using an etching gas of the fluoro-carbon system (for example, $CHF_3$ or $CF_4$). Thus, the contact holes 45 exposing the tops of the corresponding contact pads 42a and 42b are formed in the peripheral circuit area A2, as shown in FIG. 6E.

Finally, after removing the photoresist film 55, an aluminum (Al) layer is formed on the third interlayer insulating layer 38 to be patterned by known processes, thereby forming the wiring conductors 46a, 46b, and 46c which are contacted with and electrically connected to the corresponding contact pads 42a, 42b, and 42c, through the contact holes 45, respectively.

Since the contact pads 42a and 42b are contacted with and electrically connected to the underlying diffusion regions 40 through the corresponding contact holes 41, the wiring conductors 46a and 46b are electrically connected to the corresponding diffusion regions 40.

Thus, the DRAM 27 with the stacked-capacitor structure according to the second embodiment as shown in FIG. 5 is finished.

With the DRAM 27 according to the second embodiment, similar to the first embodiment, when the first polysilicon layer for forming the common upper or cell-plate electrodes 36 of the capacitors 37a and 37b is selectively etched away in the peripheral circuit area A2 (see FIG. 6B), not only the part of the first polysilicon layer located in the memory cell area A1 but also the part of the first polysilicon layer located in the peripheral circuit area A2 are able to be covered with the photoresist film 55.

Therefore, the same advantage as that of the first embodiment can be obtained.

Further, because the pad insulating layer 43b and the pad protection layer 44b are formed to be continuous between the contact pads 42b and 42c, the contact pads 42b and 42c are electrically connected to each other through the pad protection layer 44b and the wiring conductors 46b and 46c. This means that the pad protection layer 44b may be used for electric interconnection of the contact pads 42b and 42c. As a result, an additional advantage that the degree of freedom in designing the element or component layout is able to be increased arises. This enables the chip area reduction of the DRAM 27.

Additionally, since the pad protection layers 44a and 44b have the polycide structure made of the polysilicon layer 57 and the $TiSi_2$ layer 56, an additional advantage of the sufficiently low sheet resistance of the pad protection layers 44a and 44b occurs.

In the DRAM 27 according to the second embodiment, the common upper electrodes 36 of the capacitors 37a and 37b and the pad protection layers 44a, and 44b are made of titanium polycide. However, instead of titanium polycide, tungsten polycide made of tungsten (W) and polysilicon, or the combination of a tungsten layer obtained by a CVD process and a polysilicon layer may be used.

It is needless to say that the values, material names, and so on specified in the above embodiments may be changed in the present invention.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor memory device comprising:
   a first step of forming a first plurality of elements and a second plurality of elements on a semiconductor substrate, said first plurality of elements being located in a memory cell area, and said second plurality of elements being located in a peripheral circuit area;
   a second step of forming a first interlayer insulating layer to cover said first and second plurality of elements over said entire substrate; said first interlayer insulating layer having a first plurality of penetrating holes located in said memory cell area and a second plurality of penetrating holes located in said peripheral circuit area;
   a third step of forming a first conductive layer on said first interlayer insulating layer, said first conductive layer being electrically connected to said first plurality of elements through said first plurality of penetrating holes in said memory cell area and said second plurality of elements through second plurality of penetrating holes in said peripheral circuit area, respectively;
   a fourth step of patterning said first conductive layer to thereby form lower electrodes of capacitors in said memory cell area and contact pads in said peripheral circuit area; said lower electrodes being electrically connected to said first plurality of elements through said first plurality of penetrating holes, respectively; and said contact pads being electrically connected to said second plurality of elements through said second plurality of penetrating holes, respectively;
   a fifth step of forming an insulating layer to cover said lower electrodes and said contact pads over the entire substrate;
   a sixth step of forming a second conductive layer on said insulating layer over said entire substrate;
   a seventh step is to pattern said insulating layer and said second conductive layer to thereby form dielectric layers and upper electrodes of said capacitors in said memory cell area and pad insulating layers and pad protection layers in said peripheral circuit area;
   an eighth step of forming a second interlayer insulating layer to cover said upper electrodes of said capacitors and said pad protection layers over said entire substrate;
   a ninth step of forming contact holes penetrating said pad insulating layers and said pad protection layers in said peripheral circuit area, thereby exposing said respective contact pads; and
   a tenth step of forming interconnection conductors contacted with and electrically connected to said contact pads through said corresponding contact holes, respectively.

2. A method as claimed in claim 4, wherein in said seventh step, said insulating layer and said second conductive layer are patterned to be continuous between adjacent two ones of said contact pads in said peripheral circuit area.

3. A method as claimed in claim 1, further comprising a step of forming a metal layer on said second conductive layer between said sixth and seventh steps.

4. A method as claimed in claim 1, further comprising a step of forming a metal layer on said second conductive layer and a step of forming a silicide layer on said second conductive layer using said metal layer thus formed are additionally between said sixth and seventh steps.

* * * * *